US008283752B2

(12) United States Patent
Nakashiba

(10) Patent No.: US 8,283,752 B2
(45) Date of Patent: Oct. 9, 2012

(54) SEMICONDUCTOR DEVICE

(75) Inventor: Yasutaka Nakashiba, Kawasaki (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 225 days.

(21) Appl. No.: 12/761,628

(22) Filed: Apr. 16, 2010

(65) Prior Publication Data
US 2010/0265024 A1 Oct. 21, 2010

(30) Foreign Application Priority Data
Apr. 20, 2009 (JP) ................................ 2009-102270

(51) Int. Cl.
*H01L 27/08* (2006.01)
(52) U.S. Cl. ...................................... 257/530; 336/200
(58) Field of Classification Search ................... 257/531; 336/200
See application file for complete search history.

(56) References Cited

U.S. PATENT DOCUMENTS
2009/0244866 A1* 10/2009 Kawano et al. ............... 361/765
2009/0302420 A1* 12/2009 Nakashiba .................... 257/531

FOREIGN PATENT DOCUMENTS
JP 2001-513276 A 8/2001
JP 2008-113093 A 5/2008
* cited by examiner

*Primary Examiner* — A. Sefer
*Assistant Examiner* — Farid Khan
(74) *Attorney, Agent, or Firm* — Sughrue Mion, PLLC

(57) ABSTRACT

In a semiconductor device, a first semiconductor chip includes a first circuit and a first inductor, and a second semiconductor chip includes a second circuit and chip-side connecting terminals. An interconnect substrate is placed over the first semiconductor chip and the second semiconductor chip. The interconnect substrate includes a second inductor and substrate-side connecting terminals. The second inductor is located above the first inductor. The chip-side connecting terminals and the two substrate-side connecting terminals are connected through first solder balls.

9 Claims, 6 Drawing Sheets

SEMICONDUCTOR DEVICE

This application is based on Japanese patent application No. 2009-102270, the content of which is incorporated herein by reference.

BACKGROUND

1. Technical Field

The present invention relates to a semiconductor device that is capable of transmitting electric signals between two circuits to which electric signals having different potentials from each other are input.

2. Related Art

To transmit electric signals between two circuits to which electric signals having different potentials from each other are input, photo couplers are often used. Each photo coupler includes a light emitting element such as a light emitting diode and a light receiving element such as a photo transistor. The light emitting element converts an input electric signal into light, and the light receiving element returns the light to an electric signal. In this manner, photo couplers transmit electric signals to each other.

However, it is difficult to reduce the size of each photo coupler due to the light emitting element and the light receiving element. Also, where the frequency of electric signals is high, the electric signals cannot be followed. To counter these problems, there has been a technique for transmitting electric signals by inductively coupling two inductors, as disclosed in Japanese translation of PCT international application NO. 2001-513276, for example.

A structure in which a pair of inductors are used when a first semiconductor chip on the transmission side and a second semiconductor chip on the reception side are connected to each other through a transmission path is disclosed in Japanese Laid-open patent publication No. 2008-113093. More specifically, a transmission line and the first semiconductor chip are connected in a noncontact manner by electromagnetically coupling the pair of inductors on the transmission side. The transmission line and the second semiconductor chip are connected in noncontact manner by electromagnetically coupling the pair of inductors on the reception side.

Where the signal voltages of the transmission-side circuit and the reception-side circuit differ from each other, the distance between the two inductors forming a pair becomes shorter, if the transmission-side circuit and the reception-side circuit are connected with the pair of inductors. As a result, insulation between the transmission-side circuit and the reception-side circuit cannot be secured.

SUMMARY

In one embodiment, there is provided a semiconductor device including:
one or two semiconductor chips that include an interconnect layer; and
an interconnect substrate attached to an interconnect layer side of the one or two semiconductor chips,
wherein the one or two semiconductor chips includes:
a first circuit that generates a signal;
a second circuit that processes the signal;
a first inductor that is formed in the interconnect layer, and is connected to one of the first circuit and the second circuit;
a chip-side connecting terminal that is formed in an uppermost layer of the interconnect layer, and is connected to the other one of the first circuit and the second circuit,
the interconnect substrate includes:
a second inductor that is located above the first inductor; and
a substrate-side connecting terminal that is connected to the second inductor, and is located above the chip-side connecting terminal,
the chip-side connecting terminal and the substrate-side connecting terminal are connected through a first solder ball or a first bump.

According to the embodiment, the first solder ball or the first bump exists between the semiconductor chips and the interconnect substrate. With this arrangement, the distance between the semiconductor chips and the interconnect substrate, or the distance between the first inductor and the second inductor, can be easily secured. Accordingly, even when the signal voltages of the first circuit and the second circuit differ from each other, insulation can be easily secured between the first circuit and the second circuit.

According to the embodiment, insulation can be easily secured between the first circuit and the second circuit, even if the signal voltages of the first circuit and the second circuit differ from each other.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
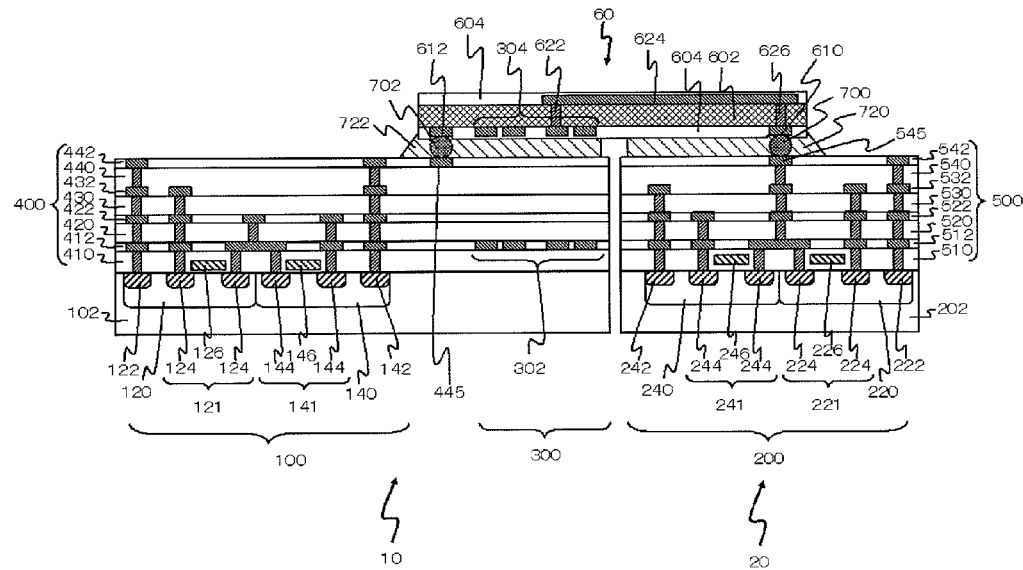
FIG. 1 is a cross-sectional view showing the structure of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following is a description of embodiments of the present invention, with reference to the accompanying drawings. In the drawings, like components are denoted by like reference numerals, and explanation of them will not be repeated in the following description.

First Embodiment

FIG. 1 is a cross-sectional view showing the structure of a semiconductor device according to a first embodiment. This semiconductor device includes two semiconductor chips 10 and 20, and an interconnect substrate 60. The semiconductor chip 10 includes a multilayer interconnect 400, and the semiconductor chip 20 includes a multilayer interconnect 500.

The semiconductor chip 10 includes a first substrate 102, a first circuit 100, and a first inductor 302. The first substrate 102 is a semiconductor substrate such as a silicon substrate. The first circuit 100 generates signals to be transmitted. The signals to be transmitted are digital signals, for example, but those signals may also be analog signals. The first inductor 302 is formed in the multilayer interconnect 400. The first inductor 302 is connected to the first circuit 100, and the signals generated by the first circuit 100 are input to the first inductor 302.

The semiconductor chip 20 includes a second substrate 202, a second circuit 200, and chip-side connecting terminals 545. The second substrate 202 is a semiconductor substrate such as a silicon substrate. The second circuit 200 receives and processes the signals generated by the first circuit 100. The chip-side connecting terminals 545 are formed in the uppermost layer of the multilayer interconnect 500. The chip-side connecting terminals 545 are connected to the second circuit 200 through the interconnects, vias, and contacts in the multilayer interconnect 500.

The first circuit 100 and the second circuit 200 may switch functions with each other. In that case, the first circuit 100 receives and processes the signals generated by the second circuit 200.

The interconnect substrate 60 is placed over the semiconductor chip 10 and the semiconductor chip 20. The interconnect substrate 60 includes a second inductor 304 and two substrate-side connecting terminals 610 (only one of them being shown in FIG. 1). The second inductor 304 is located above the first inductor 302. The two substrate-side connecting terminals 610 are connected to an end of a center portion and an end of an outer portion of the second inductor 304, and are located above the two chip-side connecting terminals 545.

The two chip-side connecting terminals 545 and the two substrate-side connecting terminals 610 are connected through first solder balls 700. The diameter of each of the first solder balls 700 is approximately 20 μm, for example.

In this embodiment, a first dummy connecting terminal 445 is provided in the semiconductor chip 10, and a second dummy connecting terminal 612 is provided in the interconnect substrate 60. The first dummy connecting terminal 445 is placed in the uppermost layer of the multilayer interconnect 400. The second dummy connecting terminal 612 is located above the first dummy connecting terminal 445. The first dummy connecting terminal 445 is not connected to any of the active elements formed in the semiconductor chip 10. The second dummy connecting terminal 612 is not connected to the interconnect transmitting signals among the interconnects in the interconnect substrate 60. The first dummy connecting terminal 445 and the second dummy connecting terminal 612 are connected through a second solder ball 702. The diameter of the second solder ball 702 is substantially the same as the diameter of the first solder balls 700.

The space between the interconnect substrate 60 and the semiconductor chip 20 is sealed with sealing resin 720. Accordingly, the first solder balls 700, the chip-side connecting terminal 545, and the substrate-side connecting terminal 610 are protected by the sealing resin 720. The space between the interconnect substrate 60 and the semiconductor chip 10 is sealed with sealing resin 722. Accordingly, the second solder ball 702, the first dummy connecting terminal 445, and the second dummy connecting terminal 612 are protected by the sealing resin 722.

The interconnect substrate 60 in the example illustrated in FIG. 1 is an interposer that is formed with a substrate 602 made of resin. Protection layers 604 such as solder resist layers are formed on both sides of the substrate 602. Alternatively, the interconnect substrate 60 may be a silicon interposer. Where the interconnect substrate 60 is a silicon interposer, and the first substrate 102 and the second substrate 202 are silicon substrates, the substrate 602 of the interconnect substrate 60 is formed with the three layers of an insulating film, a silicon substrate, and an insulating film, and the impurity density in the silicon substrate of the substrate 602 is preferably lower than the substrate impurity density in the first substrate 102 and the substrate impurity density of the second substrate 202. With this arrangement, generation of eddy current in the substrate 602 can be restrained.

In this embodiment, the second inductor 304 is formed on the face of the interconnect substrate 60 facing the semiconductor chips 10 and 20. The end of the center portion of the second inductor 304 is connected to one of the substrate-side connecting terminals 610 through a penetrating interconnect 622 penetrating through the substrate 602, an interconnect 624, and a penetrating interconnect 626 penetrating through the substrate 602. The interconnect 624 is formed on the face of the substrate 602 not facing the semiconductor chips 10 and 20. The end of the outer portion of the second inductor 304 is connected to the other one (not shown) of the substrate-side connecting terminals 610 through an interconnect (not shown in FIG. 1) formed in the same layer as the second inductor 304.

The first inductor 302 and the second inductor 304 constitute a signal transmission element 300. The signal transmission element 300 transmits signals through inductive coupling between the first inductor 302 and the second inductor 304. In this embodiment, the first circuit 100 is a transmission circuit, and the second circuit 200 is a reception circuit. Accordingly, the first inductor 302 functions as a transmission-side inductor, and the second inductor 304 functions as a reception-side inductor.

In this embodiment, the multilayer interconnect 400 has a structure that is formed by stacking an insulating layer 410, an interconnect layer 412, an insulating layer 420, an interconnect layer 422, an insulating layer 430, an interconnect layer 432, an insulating layer 440, and an interconnect layer 442 in this order. In the example illustrated in this drawing, the first inductor 302 is provided in the interconnect layer 412 as the first interconnect layer of the multilayer interconnect 400. Alternatively, the first inductor 302 may be provided in some other interconnect layer, such as the interconnect layer 442 that is the uppermost layer.

The multilayer interconnect 500 has a structure that is formed by stacking an insulating layer 510, an interconnect layer 512, an insulating layer 520, an interconnect layer 522, an insulating layer 530, an interconnect layer 532, an insulating layer 540, and an interconnect layer 542 in this order.

Each of the insulating layers forming the multilayer interconnects 400 and 500 may have a structure formed by stacking insulating a plurality of films, or may be a single insulating film. Each of the multilayer interconnects 400 and 500 is covered with a protection film (not shown). The number of layers in the multilayer interconnect 400 may be the same as or differ from the number of layers in the multilayer interconnect 500.

The interconnect of each of the interconnect layers is a Cu interconnect formed by the damascene technique, and is buried in a groove formed in the corresponding interconnect layer. Connecting terminals such as pads, or the chip-side connecting terminals 545 of the semiconductor chip 20, for example, are formed in the interconnect of the uppermost layer. Alternatively, in the multilayer interconnects 400 and 500, at least one of the interconnect layers may be an Al-alloy interconnect. The interconnects formed in the interconnect layers are connected to one another via plugs buried in the insulating layers.

Each of the insulating layers forming the insulating layers and the interconnect layers may be a $SiO_2$ film or a low-permittivity film. Low-permittivity films may be insulating films having relative permittivity of 3.3 or lower, more preferably 2.9 or lower. Examples of low-permittivity films that may be used include not only SiOC but also polyhydrogen siloxane such as HSQ (hydrogen silsesquioxane), MSQ (methyl silsesquioxane), or MHSQ (methylated hydrogen silsesquioxane), an aromatic-group-containing organic material such as polyarylether (PAE), divinylsiloxane-bis-benzocyclobutene (BCB), or Silk (a registered trade name), SOG, FOX (flowable oxide) (a registered trade name), CYTOP (a registered trade name), BCB (Benzocyclobutene), and the likes. Porous films of those substances may also be used as low-permittivity films.

Where the thicknesses of the multilayer interconnect 400 and the multilayer interconnect 500 differ from each other, the interconnect substrate 60 might be slanted. In such a case, the backgrinding amounts of the first substrate 102 and the second substrate 202 are changed so that the semiconductor chip 10 and the semiconductor chip 20 have the same thickness.

For example, the first circuit 100 is a transmission-side driver circuit (such as a gate driver). The first circuit 100 amplifies a transmission signal generated by modulating a digital signal, and outputs the amplified signal to the first inductor 302. For example, the second circuit 200 is a reception-side driver circuit (such as a gate driver). The second circuit 200 amplifies and then outputs a digital signal generated by modulating a signal received by the second inductor 304.

The potentials of electric signals to be input to the first circuit 100 and the second circuit 200 differ from each other. However, since the signal transmission element 300 transmits electric signals though inductive coupling, no problems occur in the first circuit 100 and the second circuit 200. Where "the potentials of electric signals to be input differ from each other" in the structure illustrated in FIG. 1, the amplitudes (the differences between the potential indicating "0" and the potential indicating "1") of the electric signals might differ from each other, the reference potentials (the potentials indicating "0") of the electric signals might differ from each other, the amplitudes of the electric signals might differ from each other while the reference potentials of the electric signals differ from each other, or the like.

The first circuit 100 of the semiconductor chip 10 includes first transistors. The first transistors are an n-type transistor and a p-type transistor. The n-type first transistor 121 is formed in a p-type well 120, and includes two n-type impurity regions 124 to be the source and drain, and a gate electrode 126. The p-type first transistor 141 is formed in an n-type well 140, and includes two p-type impurity regions 144 to be the source and drain, and a gate electrode 146. A gate insulating film is provided below each of the gate electrodes 126 and 146. Those two gate insulating films have substantially the same thickness. The first transistors 121 and 141 constitute the above-mentioned transmission-side driver circuit that is an inverter, for example.

A p-type impurity region 122 is formed in the well 120, and an n-type impurity region 142 is formed in the well 140. An interconnect for applying the reference potential (the ground potential) of the n-type first transistor 121 is connected to the impurity region 122, and an interconnect for applying the power-supply potential of the p-type first transistor 141 is connected to the impurity region 142.

The second circuit 200 of the semiconductor chip 20 includes second transistors. The second transistors include an n-type transistor and a p-type transistor. The n-type second transistor 221 is formed in a p-type well 220, and includes two n-type impurity regions 224 to be the source and drain, and a gate electrode 226. The p-type second transistor 241 is formed in an n-type well 240, and includes two p-type impurity regions 244 to be the source and drain, and a gate electrode 246. A gate insulating film is provided below each of the gate electrodes 226 and 246. The second transistors 221 and 241 constitute the above-mentioned reception-side driver circuit that is an inverter, for example.

A p-type impurity region 222 is formed in the well 220, and an n-type impurity region 242 is formed in the well 240. An interconnect for applying the reference potential of the n-type second transistor 221 is connected to the impurity region 222, and an interconnect for applying the power-supply potential of the p-type second transistor 241 is connected to the impurity region 242.

In the example illustrated in this drawing, the gate insulating films of the first transistors 121 and 141 and the gate insulating films of the second transistors 221 and 241 have different thicknesses from each other, but may have the same thickness.

The area of the interconnect substrate 60 is smaller than the sum of the area of the semiconductor chip 10 and the area of the semiconductor chip 20.

Figure 2:
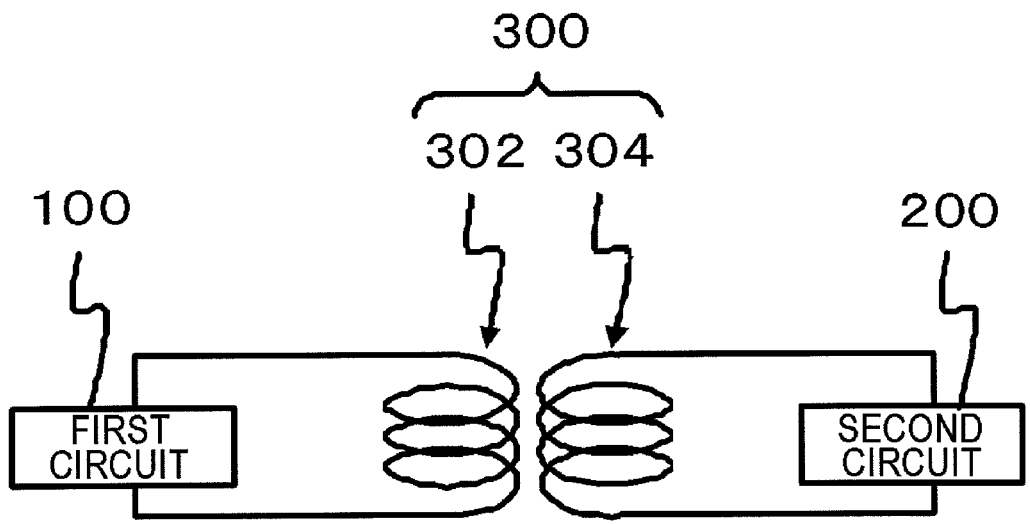
FIG. 2 is an equivalent circuit diagram of the semiconductor device shown in FIG. 1.

FIG. 2 is an equivalent circuit diagram of the semiconductor device shown in FIG. 1. The signals generated by the first circuit 100 are received by the second circuit 200 through the signal transmission element 300. The signal transmission element 300 transmits the signals by virtue of the inductive coupling between the first inductor 302 and the second inductor 304.

Figure 3:
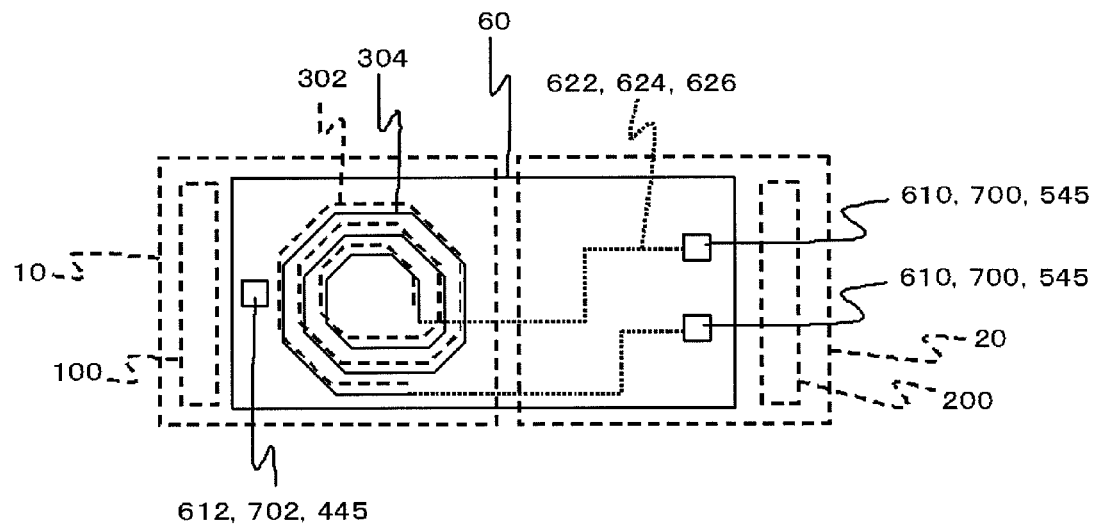
FIG. 3 is a schematic plan view of the semiconductor device shown in FIG. 1.

FIG. 3 is a schematic plan view of the semiconductor device shown in FIG. 1. As described above, the interconnect substrate 60 includes the two substrate-side connecting terminals 610, and the semiconductor chip 20 includes the two chip-side connecting terminals 545. One of the substrate-side connecting terminals 610 is connected to the end of the center portion of the second inductor 304 through the penetrating interconnect 622, the interconnect 624, and the penetrating interconnect 626. The other one of the substrate-side connecting terminals 610 is connected to the end of the outer portion of the second inductor 304 through the interconnect formed in the same layer as the second inductor 304. The two substrate-side connecting terminals 610 are connected to the chip-side connecting terminals 545 through the first solder balls 700.

The semiconductor chip 10 also includes the first dummy connecting terminal 445, and the interconnect substrate 60 includes the second dummy connecting terminal 612. The first dummy connecting terminal 445 is connected to the second dummy connecting terminal 612 through the second solder ball 702. The semiconductor device may include a plurality of sets of the first dummy connecting terminal 445, the second solder ball 702, and the second dummy connecting terminal 612.

Next, the functions and advantages of this embodiment are described. The potentials of electric signals to be input to the first circuit 100 and the second circuit 200 differ from each other. The pressure resistance between the first circuit 100 and the second circuit 200 is determined by the distance between the first inductor 302 of the semiconductor chip 10 and the second inductor 304 of the interconnect substrate 60. In this embodiment, the semiconductor chip 20 and the interconnect substrate 60 are connected with the use of the first solder balls 700. Accordingly, the distance between the semiconductor chip 10 and the interconnect substrate 60, or the distance between the first inductor 302 and the second inductor 304, can be readily secured. In this manner, the pressure resistance or insulation between the first circuit 100 and the second circuit 200 can be easily secured.

Also, the first dummy connecting terminal 445 is provided in the semiconductor chip 10, and the second dummy connecting terminal 612 is provided in the interconnect substrate 60. The first dummy connecting terminal 445 and the second dummy connecting terminal 612 are connected with the use of the second solder ball 702. With this arrangement, the number of solder balls that support the interconnect substrate 60 over the semiconductor chips 10 and 20 increases from two to three or more, for example. Accordingly, the interconnect substrate 60 cannot be slanted.

The end of the center portion of the second inductor 304 is connected to one of the substrate-side connecting terminals 610 through the penetrating interconnect 622, the interconnect 624, and the penetrating interconnect 626. The interconnect 624 is formed on the face of the interconnect substrate 60 opposite from the second inductor 304. With this arrangement, the end of the center portion of the second inductor 304 can be drawn to the one of the substrate-side connecting terminal 610, without interference of any other part of the second inductor 304.

Second Embodiment

Figure 4:
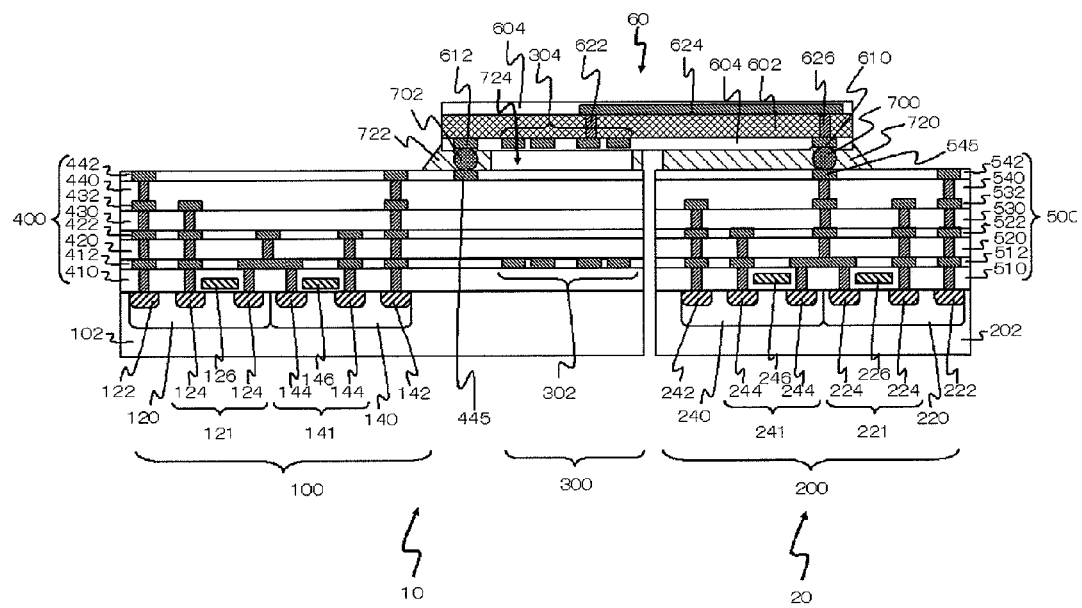
FIG. 4 is a cross-sectional view showing the structure of a semiconductor device according to a second embodiment.

FIG. 4 is a cross-sectional view showing the structure of a semiconductor device according to a second embodiment. This semiconductor device is the same as the semiconductor device of the first embodiment, except that the sealing resin 722 is not formed in a region 724 overlapping the second inductor 304 in the space between the semiconductor chip 20 and the interconnect substrate 60 when seen in a planar view. The region 724 is a space that is closed by the sealing resin 722, the interconnect substrate 60, and the semiconductor chip 20. Accordingly, where the atmosphere for forming the sealing resin 722 is a vacuum, the region 724 also becomes a vacuum.

According to this embodiment, the same effects as those of the first embodiment can be achieved. Furthermore, since the sealing resin 722 is not formed in the region overlapping the second inductor 304 in a planar view, the pressure resistance between the first inductor 302 and the second inductor 304 can be made even higher.

Third Embodiment

Figure 5:
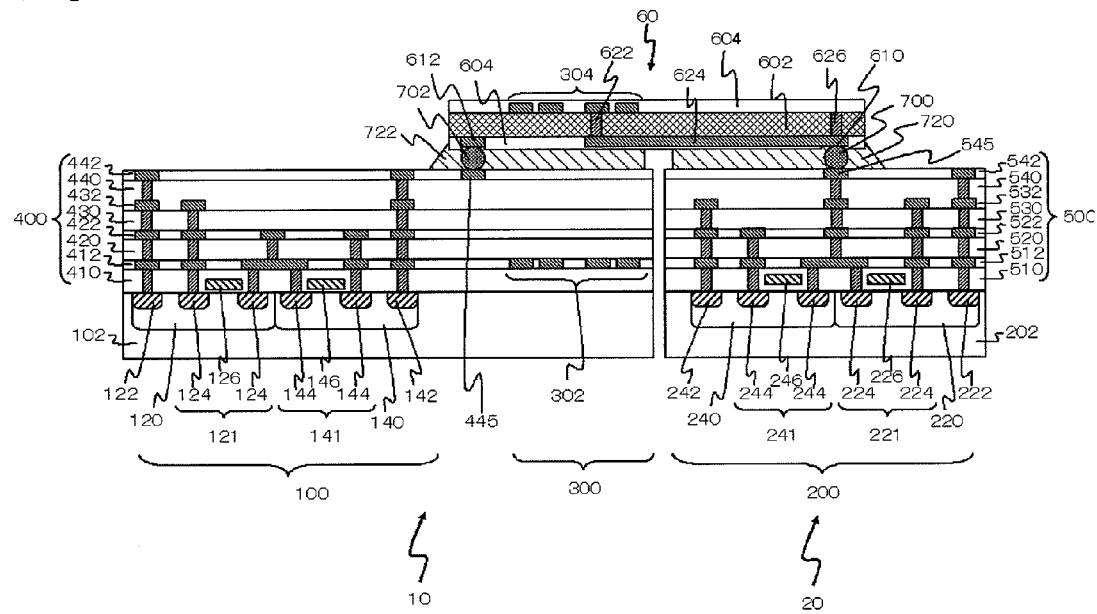
FIG. 5 is a cross-sectional view showing the structure of a semiconductor device according to a third embodiment.

FIG. 5 is a cross-sectional view showing the structure of a semiconductor device according to a third embodiment. This semiconductor device is the same as the semiconductor device of the first embodiment, except for the following matters. First, the face of the interconnect substrate 60 having the interconnect 624 formed thereon faces the semiconductor chips 10 and 20. The second dummy connecting terminal 612 is formed on the face having the interconnect 624 formed thereon.

According to this embodiment, the same effects as those of the first embodiment can also be achieved. In this embodiment, the sealing resin 722 may be formed in the same manner as in the second embodiment.

Fourth Embodiment

Figure 6:
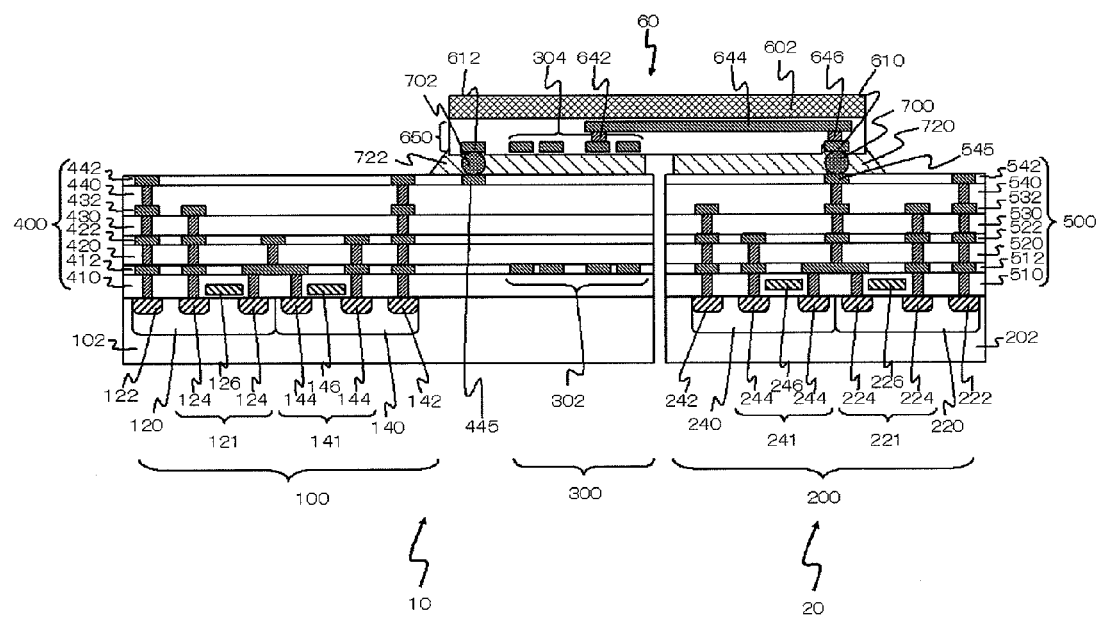
FIG. 6 is a cross-sectional view showing the structure of a semiconductor device according to a fourth embodiment.

FIG. 6 is a cross-sectional view showing the structure of a semiconductor device according to a fourth embodiment. This semiconductor device has the same structure as the semiconductor device of the first embodiment, except for the connecting structure between the end of the center portion of the second inductor and one of the substrate-side connecting terminals 610 in the interconnect substrate 60.

In this embodiment, the interconnect substrate 60 includes a multilayer interconnect 650. The second inductor 304 is formed in one of the layers in the multilayer interconnect 650. The end of the center portion of the second inductor 304 is connected to one of the substrate-side connecting terminals 610 through an interconnect 644 and plugs 642 and 646 of the multilayer interconnect 650 that are formed in a different layer from the second inductor 304. The plug 642 connects the interconnect 644 and the end of the center portion of the second inductor 304, and the plug 646 connects the interconnect 644 and the substrate-side connecting terminal 610.

According to this embodiment, the same effects as those of the first embodiment can also be achieved. In the second or third embodiment, the connecting structure between the end of the center portion of the second inductor and one of the substrate-side connecting terminals 610 may be the same as that in this embodiment.

Fifth Embodiment

Figure 7:
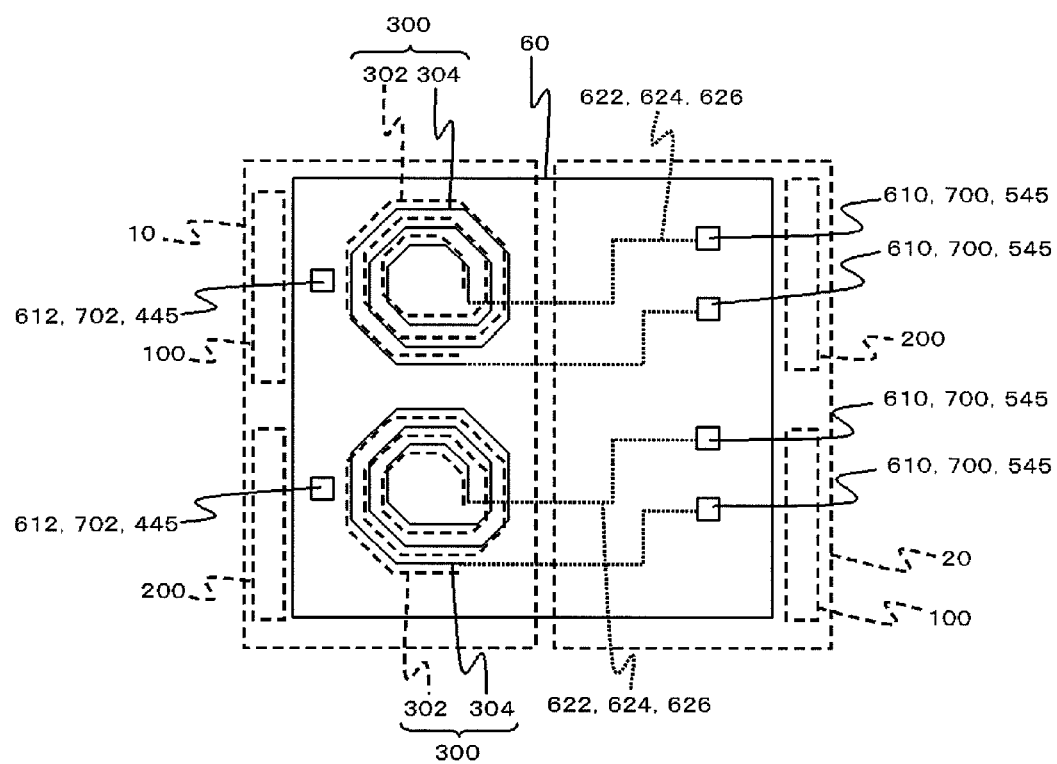
FIG. 7 is a plan view showing the structure of a semiconductor device according to a fifth embodiment.

FIG. 7 is a plan view showing the structure of a semiconductor device according to a fifth embodiment. This drawing corresponds to FIG. 3 illustrating the first embodiment. In the semiconductor device according to this embodiment, the semiconductor chip 10 and the semiconductor chip 20 bidirectionally perform communications. This semiconductor device has the same structure as one of the first through third embodiments except for the following matters.

This semiconductor device includes two sets of the first circuit 100, the first inductor 302, the second circuit 200, the two chip-side connecting terminals 545, the second inductor 304, and the two substrate-side connecting terminals 610. The two sets of the two chip-side connecting terminals 545 and the two sets of the two substrate-side connecting terminals 610 are respectively connected through the first solder balls 700.

More specifically, the semiconductor chip 10 includes one of the first circuits 100, one of the second circuits 200, and the two first inductors 302. The semiconductor chip 20 includes the other one of the first circuits 100, the other one of the second circuits 200, and the two sets of the two chip-side connecting terminals 545. The interconnect substrate 60 includes the second inductors 304 located respectively above the two first inductors 302, and the substrate-side connecting terminals 610 located respectively above the four chip-side connecting terminals 545.

The first circuit 100 of the semiconductor chip 10 and the second circuit 200 of the semiconductor chip 20 transmit and receive signals through a signal transmission element 300 formed with one of the first inductors 302 and one of the second inductors 304. The second circuit 200 of the semiconductor chip 10 and the first circuit 100 of the semiconductor chip 20 transmit and receive signals through a signal transmission element 300 formed with the other one of the first inductors 302 and the other one of the second inductors 304.

In this embodiment, a plurality of sets (two sets, for example) of the first dummy connecting terminal 445, the second dummy connecting terminal 612, and the second solder ball 702 are provided in the semiconductor chip 10.

According to this embodiment, the same effects as those of any of the first through third embodiments can be achieved. Where the four chip-side connecting terminals 545 are not arranged in the same straight line in this embodiment, the interconnect substrate 60 cannot be slanted, even if the first dummy connecting terminal 445, the second dummy connecting terminal 612, and the second solder ball 702 are not provided.

Sixth Embodiment

Figure 8:
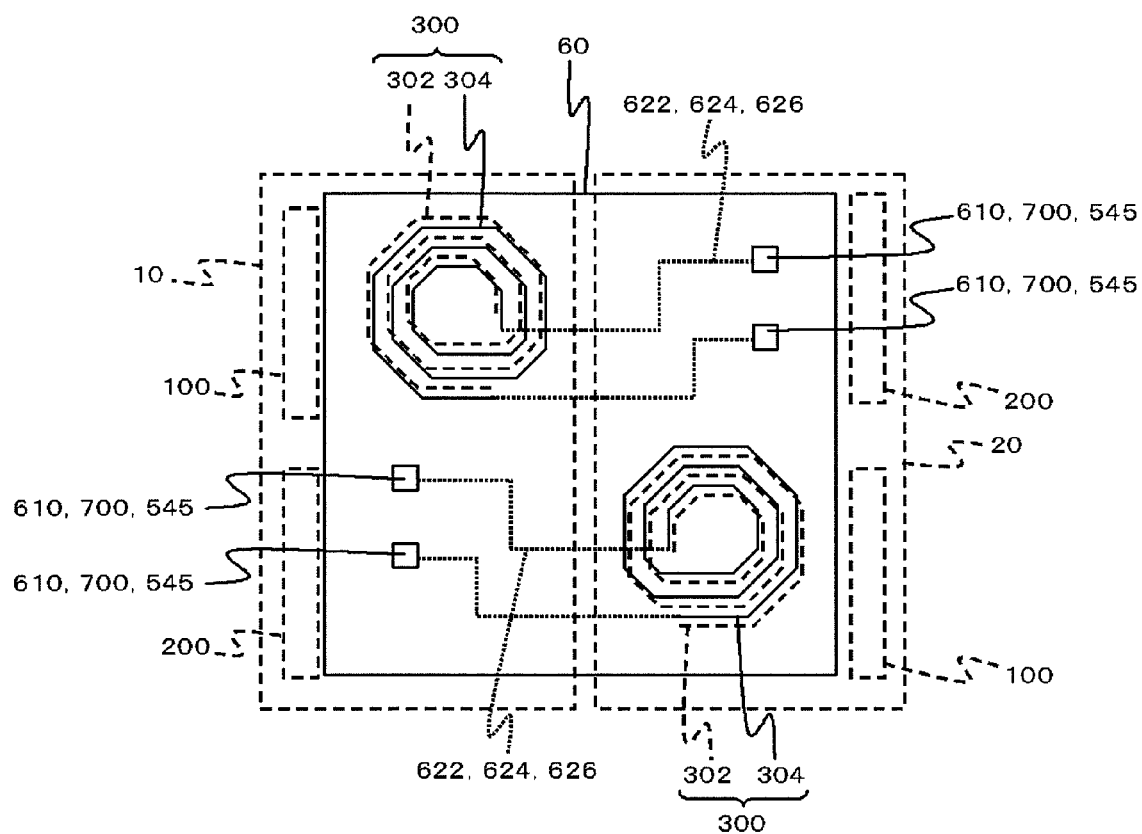
FIG. 8 is a plan view showing the structure of a semiconductor device according to a sixth embodiment.

FIG. 8 is a plan view showing the structure of a semiconductor device according to a sixth embodiment. This drawing corresponds to FIG. 7 illustrating the fifth embodiment. Like the semiconductor device according to the fifth embodiment, the semiconductor device according to this embodiment includes two sets of the first circuit 100, the first inductor 302, the second circuit 200, the two chip-side connecting terminals 545, the second inductor 304, and the two substrate-side connecting terminals 610. This semiconductor device has the same structure as the semiconductor device according to the fifth embodiment, except for the following matters.

First, the first circuit 100 and the first inductor 302 of the first set, and the second circuit 200 and the two chip-side connecting terminals 545 of the second set are formed in the semiconductor chip 10. The first circuit 100 and the first inductor 302 of the second set, and the second circuit 200 and the two chip-side connecting terminals 545 of the first set are formed in the second semiconductor chip 20.

The first circuit 100 of the semiconductor chip 10 and the second circuit 200 of the semiconductor chip 20 transmit and receive signals through a signal transmission element 300 formed with the first inductor 302 provided in the semiconductor chip 10 and the second inductor 304 located above this first inductor 302. Likewise, the second circuit 200 of the semiconductor chip 10 and the first circuit 100 of the semiconductor chip 20 transmit and receive signals through a signal transmission element 300 formed with the first inductor 302 provided in the semiconductor chip 20 and the second inductor 304 located above this first inductor 302.

The semiconductor device does not include the first dummy connecting terminal 445, the second dummy connecting terminal 612, and the second solder ball 702.

According to this embodiment, the same effects as those of the fifth embodiment can be achieved. Furthermore, since the chip-side connecting terminals 545, the first solder ball 700, and the substrate-side connecting terminals 610 are provided for each of the semiconductor chip 10 and the semiconductor chip 20, the interconnect substrate 60 cannot be slanted, even if the first dummy connecting terminal 445, the second dummy connecting terminal 612, and the second solder ball 702 are not provided.

Seventh Embodiment

Figure 9:
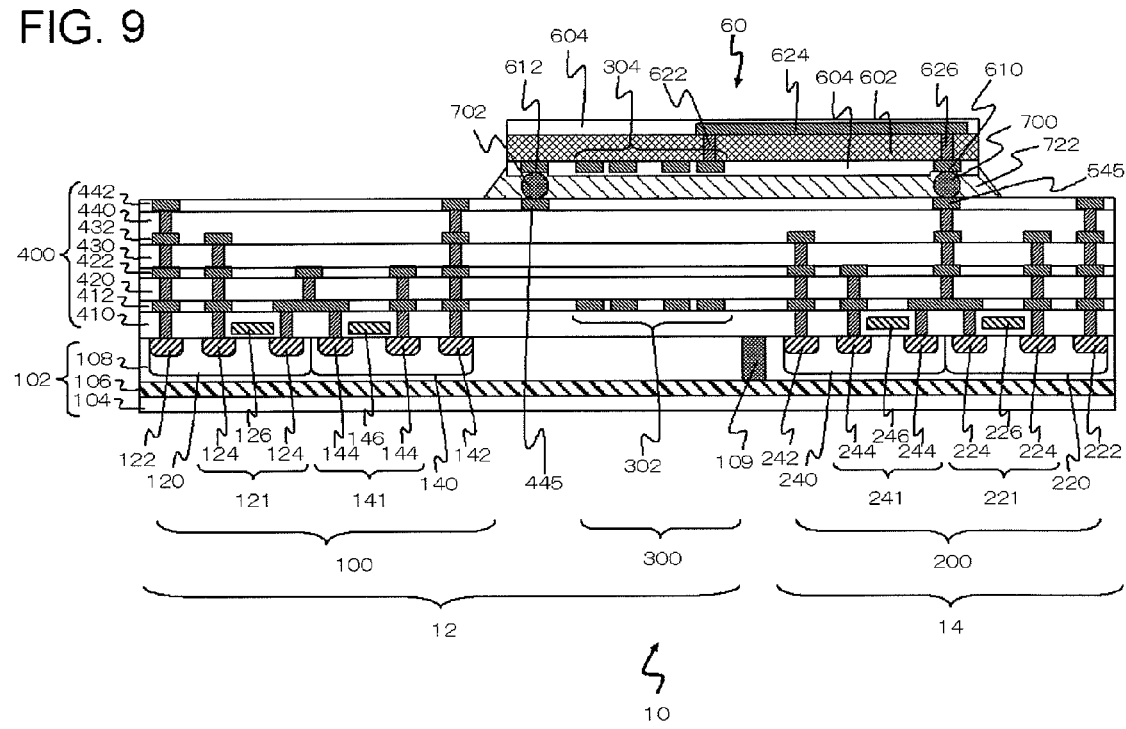
FIG. 9 is a cross-sectional view showing the structure of a semiconductor device according to a seventh embodiment.

FIG. 9 is a cross-sectional view showing the structure of a semiconductor device according to a seventh embodiment. This semiconductor device has the same structure as one of the first through sixth embodiments, except that the first substrate 102 of the semiconductor chip 10 is a SOI substrate, and that the semiconductor chip 20 is integrated with the semiconductor chip 10. FIG. 9 illustrates an example structure equivalent to the structure according to the first embodiment.

The first circuit 100, the second circuit 200, the first inductor 302, and the second inductor 304 are formed in the semiconductor chip 10, and the semiconductor device does not include the semiconductor chip 20. The first circuit 100 and the first inductor 302 are formed in a first region 12 of the semiconductor chip 10, and the second circuit 200 and the second inductor 304 are formed in a second region 14 of the semiconductor chip 10.

The first substrate 102 is a SOI (Silicon On Insulator) substrate, and has a structure having an insulating film 106 and a silicon layer 108 stacked in this order on a silicon substrate 104. A dielectric isolation film 109 that insulates the first region 12 and the second region 14 from each other is buried in the silicon layer 108. The lower end of the dielectric isolation film 109 reaches the insulating film 106.

According to this embodiment, the same effects as those of any of the first through third embodiments can also be achieved. Furthermore, the first circuit 100 as a transmission circuit and the second circuit 200 as a reception circuit can be formed in the semiconductor chip 10.

Although embodiments of the present invention have been described so far with reference to the accompanying drawings, those embodiments are merely examples of the present invention, and various structures other than the above described ones may be employed. For example, in each of the above described embodiments, bumps such as gold bumps may be used, instead of the first solder balls 700 and the second solder ball 702.

It is apparent that the present invention is not limited to the above embodiment, but may be modified and changed without departing from the scope and spirit of the invention.

What is claimed is:

1. A semiconductor device comprising:
   one or two semiconductor chips that include an interconnect layer; and
   an interconnect substrate attached to an interconnect layer side of said one or two semiconductor chips,
   wherein said one or two semiconductor chips includes:
   a first circuit that generates a signal;
   a second circuit that processes said signal;
   a first inductor that is formed in said interconnect layer, and is connected to one of said first circuit and said second circuit;
   a chip-side connecting terminal that is formed in an uppermost layer of said interconnect layer, and is connected to the other one of said first circuit and said second circuit,
   said interconnect substrate includes:
   a second inductor that is located above said first inductor; and
   a substrate-side connecting terminal that is connected to said second inductor, and is located above said chip-side connecting terminal,
   said chip-side connecting terminal and said substrate-side connecting terminal are connected through a first solder ball or a first bump.

2. The semiconductor device according to claim 1, further comprising:
   a first dummy connecting terminal that is formed in the uppermost layer of said interconnect layer of said one or two semiconductor chips; and
   a second dummy connecting terminal that is formed in said interconnect substrate, and is located above said first dummy connecting terminal,
   wherein said first dummy connecting terminal and said second dummy connecting terminal are connected through a second solder ball or a second bump.

3. The semiconductor device according to claim 1, further comprising
   a sealing resin that seals a space between said one or two semiconductor chips and said interconnect substrate,
   wherein said sealing resin is not formed in a region that overlaps said second inductor when seen in a planar view.

4. The semiconductor device according to claim 1,
wherein said second inductor is formed on one face of said interconnect substrate, and
an end of a center portion of said second inductor is connected to said substrate-side connecting terminal through a penetrating interconnect penetrating through said interconnect substrate, and an interconnect provided on the other face of said interconnect substrate.

5. The semiconductor device according to claim 1,
wherein said interconnect substrate includes a multilayer interconnect,
said second inductor is formed in said multilayer interconnect, and
the end of the center portion of said second inductor is connected to said substrate-side connecting terminal through an interconnect formed in a layer different from a layer having said second inductor in said multilayer interconnect, and a via.

6. The semiconductor device according to claim 1, comprising
two sets each of said first circuit, said first inductor, said second circuit, and said two chip-side connecting terminals that are provided in said one or two semiconductor chips, and two sets each of said second inductor and said substrate-side connecting terminal that are provided in said interconnect substrate,
wherein said two sets of said two chip-side connecting terminals and said two sets of said substrate-side connecting terminal are respectively connected through said first solder ball or said first bump.

7. The semiconductor device according to claim 6, comprising
a first semiconductor chip and a second semiconductor chip as said one or two semiconductor chips,
wherein said interconnect substrate is placed over said first semiconductor chip and said second semiconductor chip,
said first circuit and said first inductor of a first set, and said second circuit and said two chip-side connecting terminals of a second set are formed in said first semiconductor chip, and
said first circuit and said first inductor of said second set, and said second circuit and said two chip-side connecting terminals of said first set are formed in said second semiconductor chip.

8. The semiconductor device according to claim 1, comprising
a first semiconductor chip and a second semiconductor chip as said one or two semiconductor chips,
wherein said first circuit and said first inductor are formed in said first semiconductor chip,
said second circuit is formed in said second semiconductor chip, and
said interconnect substrate is placed over said first semiconductor chip and said second semiconductor chip.

9. The semiconductor device according to claim 1,
wherein said first circuit, said second circuit, said first inductor, and said chip-side connecting terminal are formed in one of said semiconductor chips,
said first circuit and said first inductor are formed in a first region of said semiconductor chip,
said second circuit and said chip-side connecting terminal are formed in a second region of said semiconductor chip, and
said first region and said second region are insulated from each other.

\* \* \* \* \*